United States Patent [19]
Janz et al.

[11] Patent Number: 5,408,110
[45] Date of Patent: Apr. 18, 1995

[54] SECOND-HARMONIC GENERATION IN SEMICONDUCTOR HETEROSTRUCTURES

[75] Inventors: Siegfried Janz, Ottawa; Hongxing Dai, Gloucester; Francoise Chatenoud, Ottawa; Michel Dion, Gloucester; Richard Normandin, Ottawa; Chan Fernando, Gloucester, all of Canada

[73] Assignee: National Research Council of Canada, Ottawa, Canada

[21] Appl. No.: 82,786

[22] Filed: Jun. 28, 1993

[51] Int. Cl.⁶ ............... H03F 7/00; H01L 29/161
[52] U.S. Cl. ..................... 257/97; 257/13; 257/94; 359/328; 359/329; 372/22; 372/45
[58] Field of Search ............ 372/21, 22, 43, 45, 372/50; 359/328, 329; 257/13, 94, 96, 97, 103, 189, 200, 201

[56] References Cited

U.S. PATENT DOCUMENTS

| 4,930,132 | 5/1990 | Shimizu et al. | 372/22 |
| 5,033,810 | 7/1991 | Inoue et al. | 359/328 |
| 5,051,617 | 9/1991 | Normandin et al. | 372/22 |
| 5,068,868 | 11/1991 | Deppe et al. | 372/45 |
| 5,202,897 | 4/1993 | Whitehead | 372/43 |
| 5,233,620 | 8/1993 | Shinozaki et al. | 372/22 |

FOREIGN PATENT DOCUMENTS

| 0206220 | 12/1986 | European Pat. Off. | 359/328 |
| 59-106171 | 6/1984 | Japan | 257/13 |

OTHER PUBLICATIONS

Normandin et al., "Enhanced Surface Emitting Waveguides for Visible, Monolithic Semiconductor Laser Sources", Electron Lett., vol. 26, 1990, pp. 2088–2089.

*Primary Examiner*—Rolf Hille
*Assistant Examiner*—Mahshid Saadat

[57] ABSTRACT

Quasi-phase matched (QPM) second-harmonic (SH) generation in the reflection geometry is described. The SH intensity can be strongly enhanced by spatially modulating the optical properties of the nonlinear medium. This type of quasi-phase matching is demonstrated using an $Al_{0.8}Ga_{0.2}As/GaAs$ heterostructure designed for $\lambda = 1.06$ μm incident light. The SH light intensity generated in reflection from the heterostructure is enhanced 70 times relative to the SH response of a homogeneous GaAs wafer. A Fabry-Perot resonant cavity design employs this structure to make thin films with extremely high SH generation efficiencies. This is of particular interest used in vertical cavity surface emitting lasers (VCSELs).

9 Claims, 11 Drawing Sheets

SECOND-HARMONIC GENERATION IN SEMICONDUCTOR HETEROSTRUCTURES

FIELD OF THE INVENTION

The invention relates to a device capable of second-harmonic generation of optical signals, and more particularly to second-harmonic generation in a layered semiconductor heterostructure designed for propagation of fundamental and second-harmonic light approximately perpendicular to the layers.

BACKGROUND OF THE INVENTION

Since the invention of the laser, there has been a great deal of interest in second-harmonic (SH) generation as a technique for obtaining coherent light at short wavelengths from long wavelength laser sources. Research in this field is driven primarily by the need for efficient methods of up converting infrared light from conventional solid-state and semiconductor laser sources to the visible wavelength range. In particular, the wide spread use of optical memory storage (e.g. compact disks) has created a demand for reliable short wavelength light sources to increase storage density. However, there has also been considerable interest in developing coherent signal detectors and processors which rely on SH or sum-frequency (SF) generation. M. M. Fejer, G. A. Magel, D. H. Jundt, and R. L. Byer, in an article entitled "Quasi Phase Matched Second-Harmonic Generation: Tuning and Tolerances", IEEE J. Quantum Electron., vol. 28, pp. 2631-2654, 1992 describe the use of quasi-phase matching (QPM) in dielectric waveguides for high efficiency SH generation.

R. Normandin, the applicant, R. L. Williams, and F. Chatenoud, in an article entitled "Enhanced Surface Emitting Waveguides For Visible, Monolithic Semiconductor Laser Sources", in Electron. Lett., vol. 26. pp. 2088-2089, 1990 describe the use of semiconductor waveguides as a means for high efficiency SH generation. However, to date there has been little exploration of SH generation in semiconductor heterostructures designed for propagation of the fundamental and SH light approximately perpendicular to the layers. Recently, such heterostructures have become increasingly important in other branches of optoelectronics; examples include vertical-cavity surface-emitting lasers (VCSELs), modulators, and optical switches. Since the material-light interaction in vertical propagation devices is enhanced using multiple reflections, as opposed to long interaction lengths in waveguide devices, device size is only limited by the transverse mode width of the light beam which is typically only a few $\mu$m.

SUMMARY OF THE INVENTION

It is an object of the invention, to provide a device which is a vertical geometry heterostructure for relatively efficient generation of second-harmonic light.

In accordance with the invention, there is provided, a semiconductor heterostructure for generating second-harmonic light, comprising a material having nonlinear properties and a region wherein the optical properties are varied periodically such that the wave vector of the variation in the material is equal to the difference between two times the wave vector of a fundamental beam and a second-harmonic beam generated in the material.

In accordance with another aspect of the invention, a semiconductor heterostructure for generating second-harmonic light is provided, comprising: a plurality of alternating layers of a first material and a second material, one of the first and second materials having a second order susceptibility such that it is capable of generating sum-frequency light when illuminated, the first and second materials being at least semi-transparent to a fundamental beam and to sum-frequency light generated, any two adjacent layers of the alternating layers being arranged in a periodic fashion, such that a layer of width $l_1$ of the first material is adjacent a layer of width $l_2$ of the second material, $l_1+l_2$ defining the length of one period, the periodicity of the layers being such that $$l_1+l_2 \approx (<1/\lambda_{SH}+2/\lambda_o>)^{-1}$$

wherein the $<>$ denotes an average value throughout the entire region and wherein $\lambda_{SH}$ is a wavelength of a second-harmonic beam generated by the fundamental beam and $\lambda_o$ is the wavelength of the fundamental beam.

In accordance with the invention, a semiconductor heterostructure for generating second-harmonic light is provided, comprising: a plurality of alternating layers of a first material and a second material, one of the first and second materials having a second order susceptibility such that it is capable of generating sum-frequency light when illuminated, the first and second materials being at least semi-transparent to a fundamental beam and to sum-frequency light generated, any two adjacent layers of the alternating layers being arranged in a periodic fashion, such that a layer of width $l_1$ of the first material is adjacent a layer of width $l_2$ of the second material, $l_1+l_2$ defining the length of one period, the periodicity of the layers being such that $$l_1 + l_2 \approx <\frac{\lambda_{sh}}{2}>$$

wherein the $<>$ denotes an average value throughout the entire region and wherein $\lambda_{SH}$ is a wavelength of a second-harmonic beam generated by the fundamental beam; and, including reflecting means bounding outer most layers forming a Fabry Perot cavity for the fundamental beam.

In accordance with another aspect of the invention, a semiconductor heterostructure for generating second-harmonic light is provided, comprising: a laser cavity including a means for providing optical gain and, a plurality of alternating layers of a first material and a second material, one of the first and second materials having a second order susceptibility such that it is capable of generating sum-frequency light when illuminated, the first and second materials being at least semi-transparent to a fundamental beam and to sum-frequency light generated, any two adjacent layers of the alternating layers being arranged in a periodic fashion, such that a layer of width $l_1$ of the first material is adjacent a layer of width $l_2$ of the second material, $l_1+l_2$ defining the length of one period, the periodicity of the layers being such that $$l_1+l_2 \approx (<1/\lambda_{SH}+2/\lambda_o>)^{-1}$$

wherein the $<>$ denotes an average value throughout the entire region and wherein $\lambda_{SH}$ is a wavelength of a second-harmonic beam generated by the fundamental beam and $\lambda_o$ is the wavelength of the fundamental beam, within the laser cavity forming a vertical-cavity surface-emitting laser having a quasi-phase matched region.

In accordance with the invention, by altering in a predefined manner, (hereafter, referred to as modulating), the linear and nonlinear optical properties of an $Al_xGa_{1-x}As$ heterostructure, QPM SH generation can be achieved using a vertical propagation geometry.

BRIEF DESCRIPTION OF THE DRAWINGS

Exemplary embodiments of the invention will be described in conjunction with the drawings in which.

DETAILED DESCRIPTION

Figure 1:
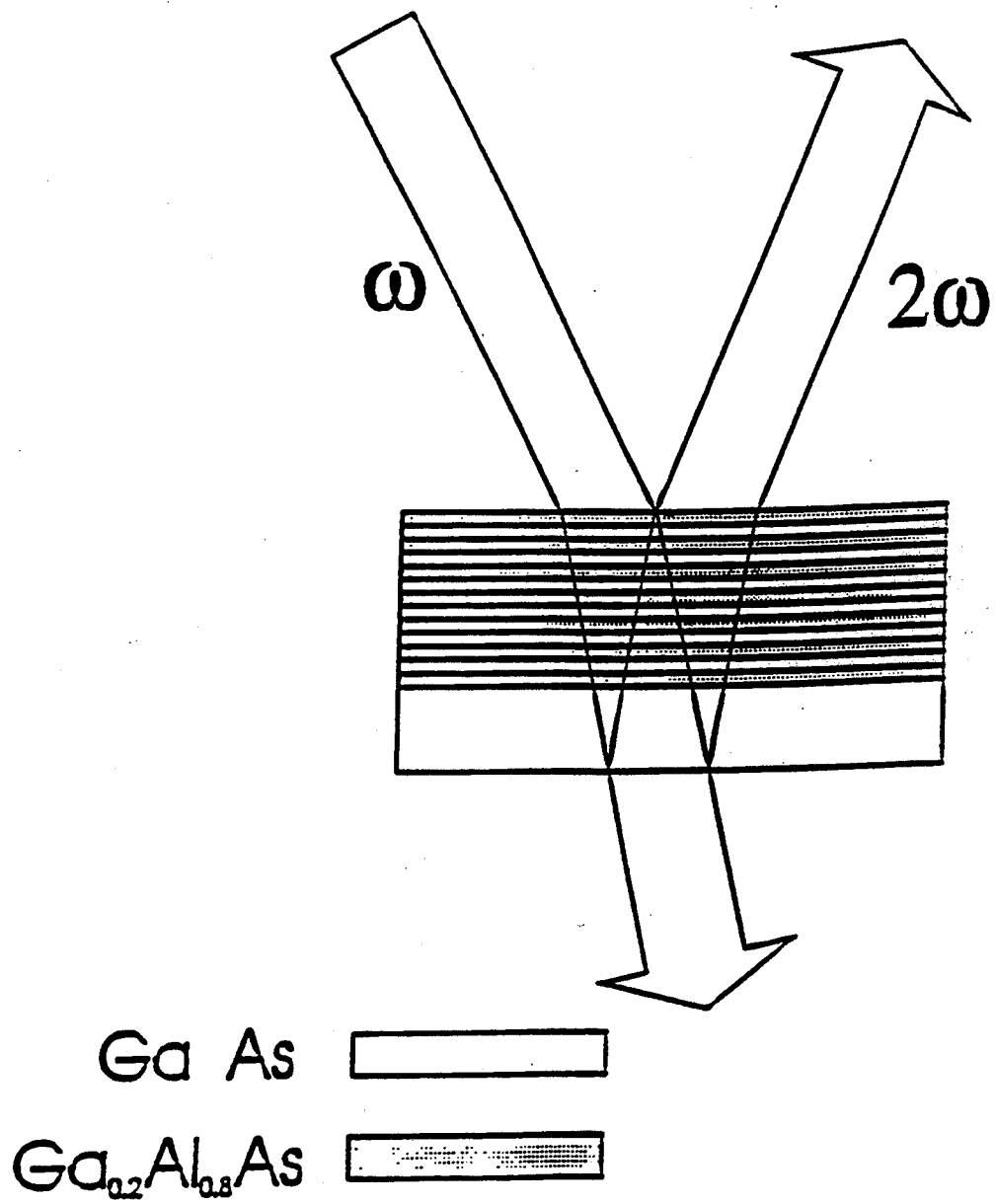
FIG. 1 is a cross-sectional view of an $Al_xGa_{1-x}As$ quasi-phase matching heterostructure showing an input signal of frequency $\omega$ and a generated output signal of frequency $2\omega$.

Referring to FIG. 1, a multi-layer heterogeneous structure is shown, having a reflection geometry. Tests have shown that the structure of FIG. 1 is capable of second-harmonic (SH) generation with efficiencies enhanced by up to 70 times relative to known, homogeneous, GaAs structures. Furthermore, in accordance with the invention, and, as will be described in greater detail, considerable improvements in SH generation efficiency can be obtained by using quasi-phase-matching in combination with Fabry-Perot heterostructures similar to those used in VCSELs.

Although SH generation in reflection is often used as a surface or near surface optical probe, the SH conversion efficiencies are too small for practical applications. Low efficiency arises, in part, because of strong, optical absorption, and also because the process is not phase matched. However, by changing in a predetermined manner or modulating the linear and nonlinear optical properties of a material in the near surface region, it is possible to achieve QPM for SH light generated in a heterostructure with a reflection geometry configuration. The geometry for QPM SH generation in reflection is shown in FIG. 1 for a 13 layer $Al_{0.8}Ga_{0.2}As/GaAs$ heterostructure. This is a special case of QPM in which the SH light is radiated in a direction approximately opposite to that of the fundamental wave. Furthermore, as described by J. P. van der Ziel and L. M. Ilegems, in Appl. Phys. Lett., vol. 28, pp. 437–439 1976, SH generation in reflection can be enhanced by using a periodic structure to couple the fundamental and SH waves by reciprocal lattice vector scattering. However, QPM SH generation, as described in this patent application, depends primarily on the modulation of the linear and nonlinear material properties. Although the example embodiment provided in this application describes a layered structure, it is entirely conceivable to envisage a non-layered heterostructure having a plurality of alternating or periodically defined regions where the properties of the material vary in a periodic manner to produce QPM SH generation. To describe reflection QPM in a multilayer structure, a Green's function formalism is used, instead of more conventional treatments of QPM, because it facilitates the incorporation of multilayer reflections effects at both the fundamental and the SH wavelengths. The Green's function formalism is described by J. E. Sipe, in an article entitled "New Green-Function Formalism for Surface Optics, J. Opt. Soc. Am. vol. 4, pp. 481–489, 1987. Only important results are highlighted, since a detailed derivation and discussion has been given previously by J. E. Sipe. In the initial description of QPM that follows, multilayer reflections will be ignored for clarity. The variation of the fields parallel to the surface are suppressed, since components of wavevectors parallel to the surface are conserved in the nonlinear interaction. Similarly, frequency (energy) is also conserved in all interactions and hence frequency dependence is likewise suppressed. The positive z-axis is taken as the surface normal. The SH polarization density, P(z), is driven by the incident field E(z) oscillating at frequency $\omega$, $$E(z) = E_\omega \exp\left[ i \int_z^0 w_1(z')dz \right], \quad (1)$$

$$P(z) = \chi^{(2)}(z):E(z)E(z) \quad (2)$$

Here $\chi^{(2)}$ is the local SH susceptibility tensor and $w_1(z)$ is the z-component of the incident light wavevector, i.e.

$$w_1(z) = \frac{\omega}{c} [n_\omega^2 - \sin^2(\theta)]^{\frac{1}{2}} \quad (3)$$

where $n_\omega$ is the refractive index and $\theta$ is the incident angle. Maxwell's equations are solved using P(z) as the source term. The upward propagating SH electric field $E_{SH}$ at the surface (z=0) is then $$E_{SH} = 2\pi i \left(\frac{2\omega}{c}\right)^2 f \int\int_{-\infty}^0 \frac{1}{w_2(x)} \chi^{(2)}(z):E_\omega E_\omega \exp\left[-i\int_z^0 w_2(z') - 2w_1(z')dz'\right]dz \quad (4)$$

Here $w_2(z)$ is the component of the SH lightwave vector normal to the surface. The function $f$ contains the dependence on the fresnel transmission coefficient of the surface, and geometrical factors arising from the relative orientation of the SH polarization and the SH electric field vectors.

The value of the integral in Eq. 4 will, in general, be small, because the integrand oscillates about zero With increasing depth z. If $\chi^{(2)}(z)/w_2(z)$ is constant, then the radiated SH field can only become large for the special case where $w_2(z)-2w_1(z)=0$, which corresponds to the conventional phase matching condition for co-propagating SH and fundamental beams. On the other hand, $E_{SH}$ can become large if the ratio $(\chi^{(2)}(z)/w_2(z))$ has a component that is modulated with a spatial frequency of the form $$\Delta(\chi^{(2)}(z)/w_2(z)) \sim \exp(iWz), \quad (5)$$

where $W=w_2(z)-2w_1(z)$ is the average of $w_2(z)-2w_1(z)$ over the multilayer. For SH generation in the reflection geometry of FIG. 1, the normal wavevector components $w_2(z)$ and $w_1(z)$ and have opposite signs, and hence $$W=(|w_2(z)|-2|w_1(z)|). \quad (6)$$

Therefore the QPM condition is satisfied when the material properties are modulated with a period $$l=2\pi[w_2+2w_1]^{-1} \quad (7)$$

Figure 2:
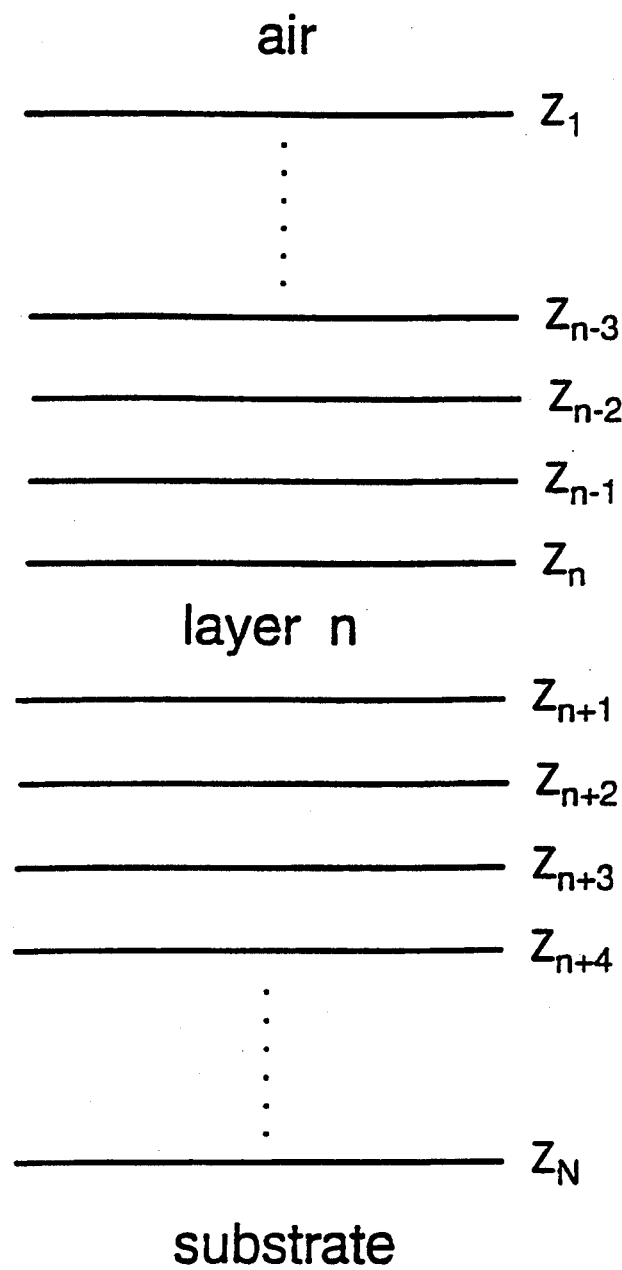
FIG. 2 is a model layer structure used in deriving the second-harmonic field within the nonlinear layer $z_n < z < z_{n+1}$.
Figure 10:
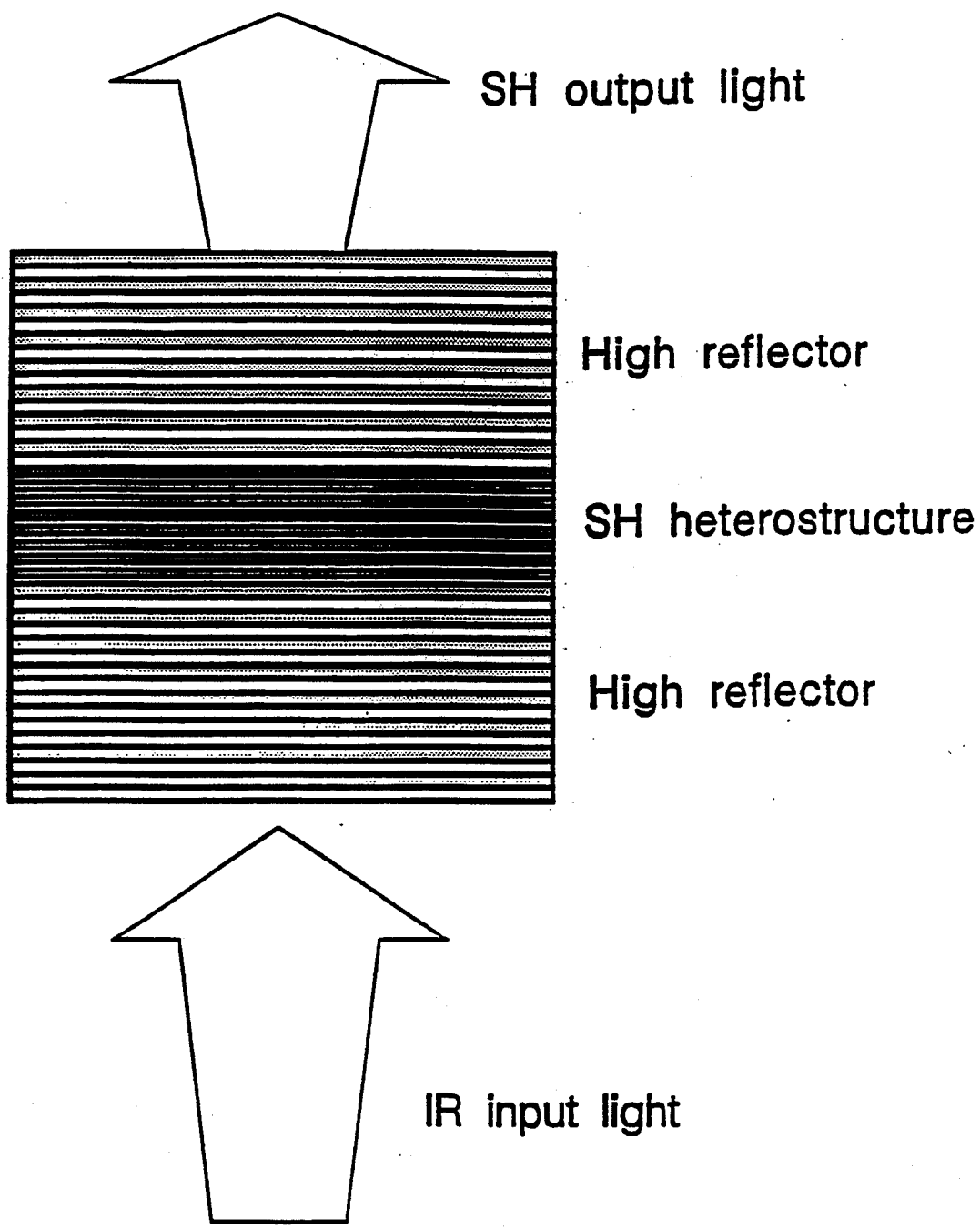
FIG. 10 is a cross sectional view of a monolithic second-harmonic heterostructure having high reflector layers forming a Fabry-Perot cavity in accordance with the invention; and, FIG. 11 is a cross sectional view of a vertical-cavity surface-emitting laser (VCSEL) including a second-harmonic heterostructure in accordance with the invention.

In contrast to the reflection geometry, the SH and fundamental beams are copropagating in conventional QPM, and hence $w_2(z)$ and $w_1(z)$ have the same sign. In this case, Eq. 4 and 5 correspond to the expressions of Fejer et al. for forward QPM. Although the above equations describe the mechanism of QPM, multilayer reflections cannot be neglected when evaluating the SH conversion efficiency of real QPM heterostructures. The cumulative effect of reflections on the fundamental beam in the structure shown in FIG. 1 is weak. On the other hand, when the QPM condition of Eq. 7 is satisfied the QPM structure will act as a slightly detuned distributed feedback grating for the SH wavelength. When the QPM structure is combined with a Fabry-Perot cavity as shown in FIG. 10, multiple reflections at both the fundamental and the SH wavelength greatly affect the performance of the structure. The structure shown in FIG. 10 of course can be fabricated by growing the layers on the top and bottom of the heterostructure, or by thin film deposition techniques. The first step in evaluating the SH response of a given multilayer is the calculation of the incident fields. The fundamental electric field E(z) at any point in the structure can be calculated from the incident field in vacuum using the transfer matrix method, generalized for arbitrary angles of incidence as described by J. E. Sipe. Having determined the fundamental field in a given layer, for example, layer n between $z_n$ and $z_{n+1}$, as shown in FIG. 2, the upward propagating SH field at $z_n$ generated within that layer is given by $$E_{SH}(z_n) = \frac{1}{1 - r_u r_d \exp(i2w_n D)} \left[\int_{z_{n+1}}^{z_n} \exp(-iw_n z')v_+(z')dz' + r_d \exp i2w_n D \int_{z_{n+1}}^{z_n} \exp(-iw_n z')v_-(z')dz'\right] \quad (8)$$

Where $$v_\pm(z) = 2\pi\left(\frac{2\omega}{c}\right)^2 \omega_n \hat{q}_{n\pm} \cdot P(z) \quad (9)$$

Here $\omega_n$ is the z-component of the SH wavevector in layer n, D is the thickness of layer n, $\hat{q}_{n\pm}$ is the polarization unit vector of the upward (+) and downward (−) propagating SH fields, and P(z) is the SH polarization at frequency $2\omega$ as determined from Eq. 2. The parameters $r_u$ and $r_d$ are the total multilayer reflection coefficients of the upper ($z=z_n$) and lower ($z=z_{n+1}$) boundaries respectively. These reflection coefficients are determined using the transfer matrix method. The two terms in the square brackets in Eq. 8 correspond to the upward radiated SH field, and the downward radiated field reflected from the ($z=z_{n+1}$) interface. Once $E_{SH}(z_n)$ is known, the transfer matrix method is once again used, this time to determine the SH field transmitted from $z_n$, through the intervening layers to the surface. Finally the SH fields at the surface arising from each individual layer in the structure are summed to yield the total radiated SH field $E_{SH}(z=0)$.

Figure 3:
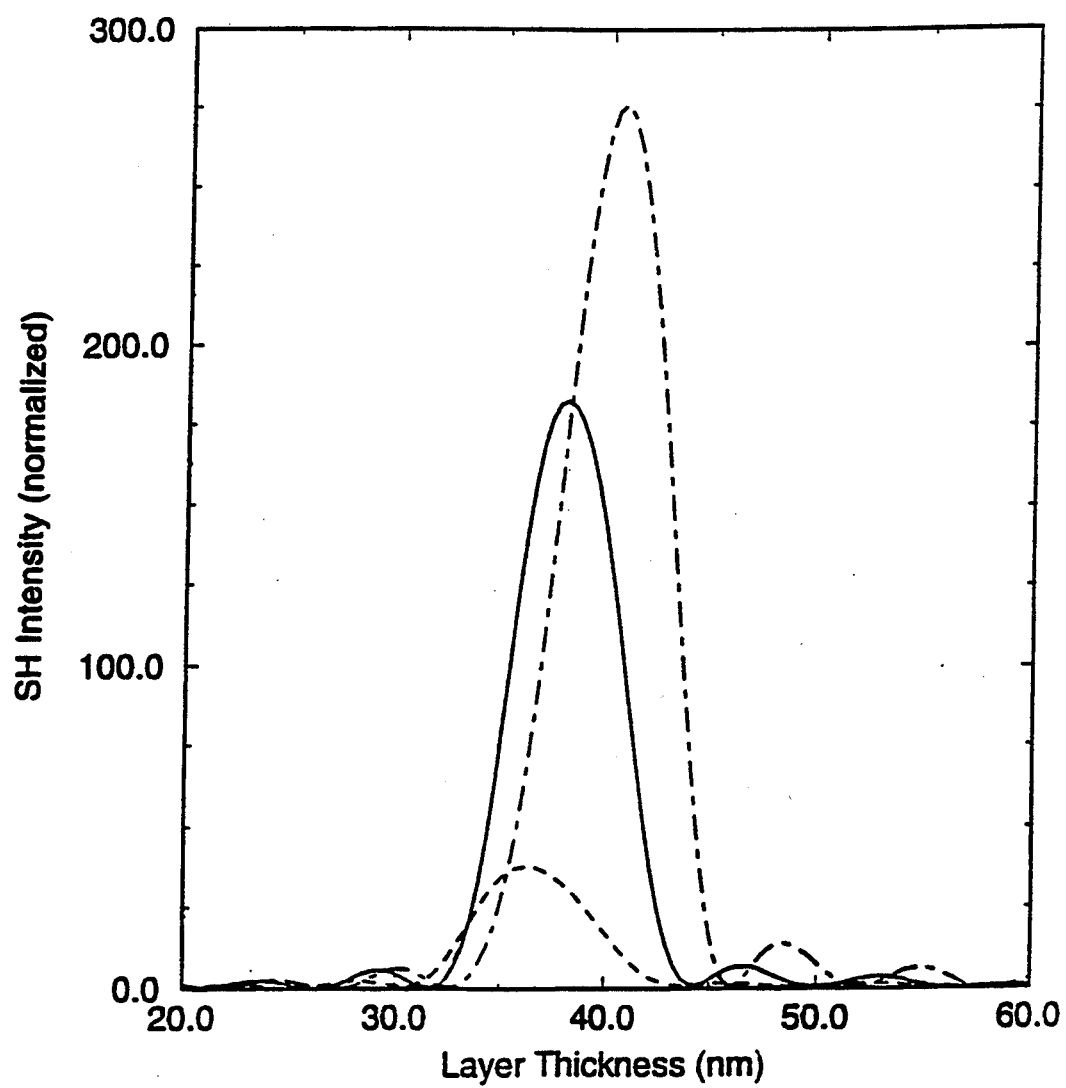
FIG. 3 is a graph of second-harmonic intensity (normalized) versus layer thickness for three QPM heterostructures.
Figure 4:
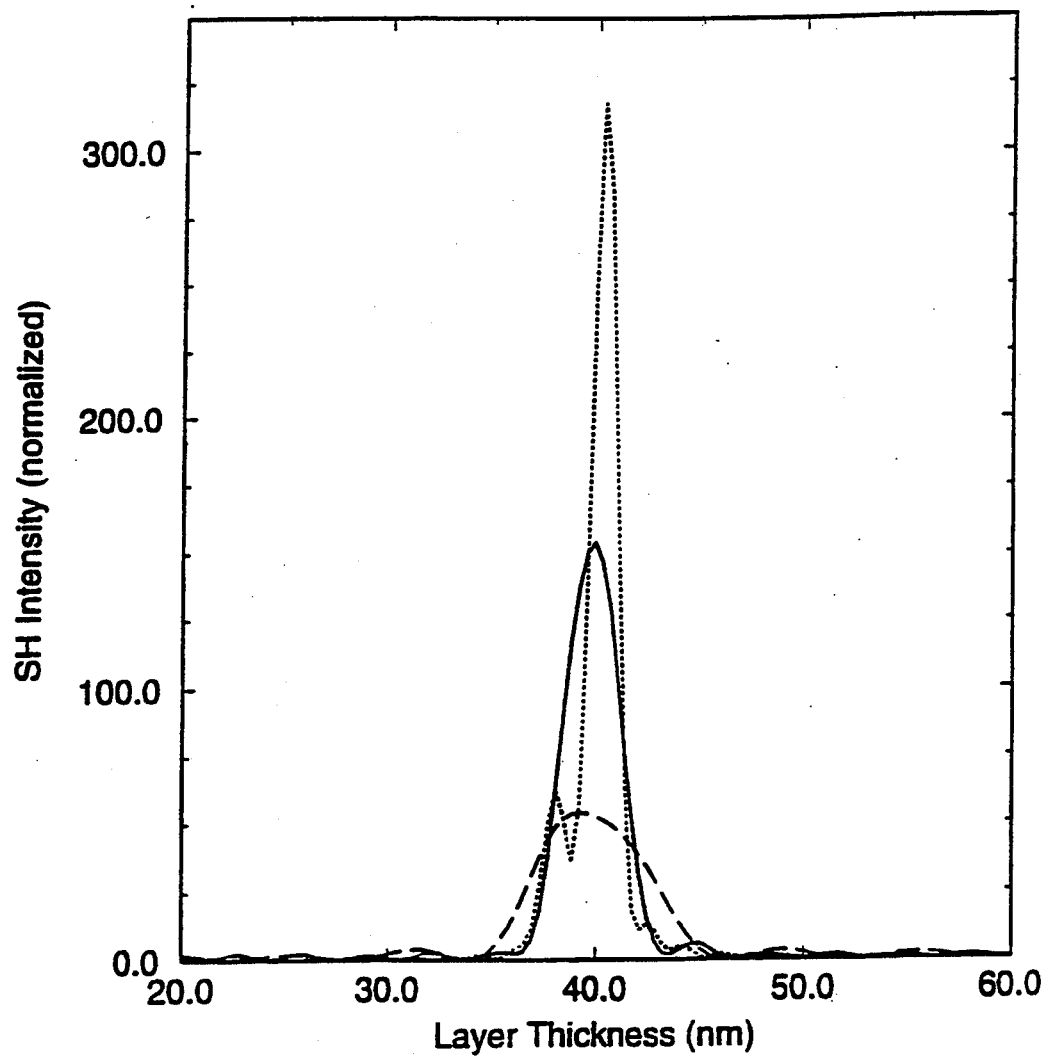
FIG. 4 is a graph of second-harmonic intensity versus layer thickness for 7, 13 and 25 layer QPM heterostructures.
Figure 5:
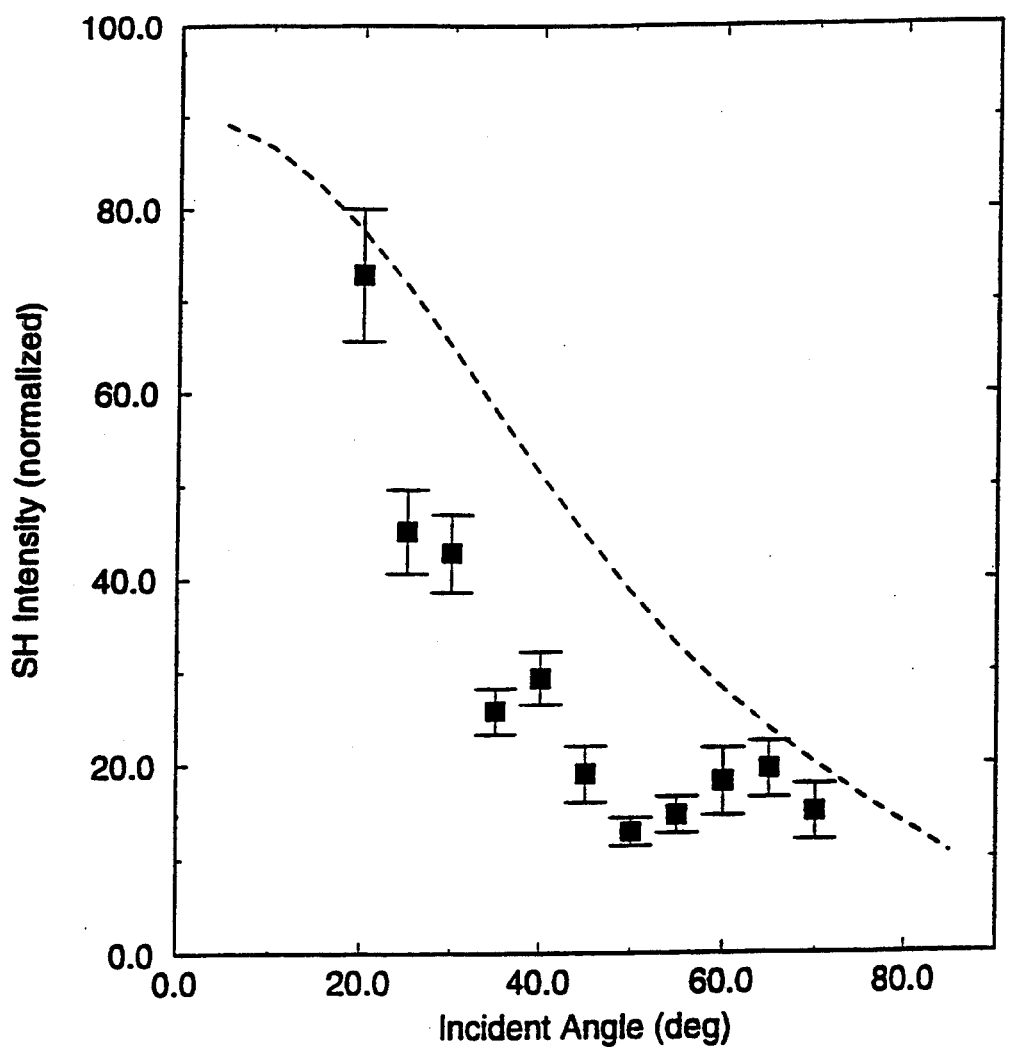
FIG. 5 is graph of an experimentally measured second-harmonic enhancement of an $Al_{0.8}Ga_{0.2}As/GaAs$ heterostructure relative to a GaAs reference, and the calculated second-harmonic enhancement (dashed curve), for $\lambda = 1.06$ $\mu$m.

Materials used for layered QPM in reflection must satisfy several requirements. The absorption depth of the SH and fundamental light should be large enough that many layers of the heterostructure contribute to the SH signal. Finally, it is preferable that the variation of the linear and nonlinear optical properties within the material system that the modulation of $\chi^{(2)}(z)/n_{2\omega}(z)$ is large (see Eq. 3 and 5). The $Al_xGa_{1-x}As$ system satisfies these requirements very well. In particular, the measured value of $\chi^{(2)}$ of $Al_xGa_{1-x}As$ at a fundamental wavelength of $\lambda=1.06$ μm decreases by an order of magnitude as x increases from 0 to 1. Thus, $\chi^{(2)}(z)/n_{2\omega}(z)$ can be varied by almost an order of magnitude by growing layers of alternating high and low Al concentration. Furthermore, the SH susceptibility of GaAs $\chi_{xyz}^{(2)}=90\times10^{-8}$ esu is much larger than that of other commonly used nonlinear crystals such as $LiNbO_3$ $\chi_{xyz}^{(2)}=2.8\times10^{-8}$, $\chi_{zzz}^{(2)}=19.4\times10^{-8}$ esu. Only the $\chi_{xyz}^{(2)}$ and xyz permutations related by symmetry) component of the SH susceptibility of $Al_xGa_{1-x}As$ is non zero. Here x, y, and z refer to the cubic unit cell axes. Therefore, at normal incidence, the SH polarization induced in (100) grown heterostructures is oriented along the surface normal and cannot radiate. Heterostructures grown on (111) substrates, on the other hand, do not suffer from this limitation. The results presented hereafter were calculated for (100) oriented $Al_x Ga_{1-x}As$ multilayers assuming a fundamental wavelength of $\lambda=1.06$ μm and an SH wavelength of $\lambda=0.532$ μm, using known values for the linear and nonlinear optical constants. The fundamental beam was s-polarized and the radiated SH beam was p-polarized, with the plane of incidence oriented at 45° to the crystal x-axis. The effect of layer thickness in a QPM heterostructure was investigated first. A 13 layer test structure consisted of alternating GaAs and $Al_x Ga_{1-x}As$ layers of equal thickness grown on a (100) GaAs substrate, as shown in FIG. 1. Calculations were carried out for x=0.6, x=0.8, and x=1.0. FIG. 3 shows the variation of the SH intensity generated in each of these structures as the layer thickness is varied between 20 and 60 nm. In these calculations, the incident angle of the fundamental beam in the vacuum is $\theta=40°$. The SH intensity is normalized relative to the SH intensity radiated from a homogeneous GaAs slab under identical excitation conditions. For each of these structures, the SH intensity shows a pronounced peak when the QPM resonance condition of Eq. 5 is satisfied. The layer thickness corresponding to this resonance shifts from 360 nm to 405 nm as the Al concentration is increased, due to the decrease in the refractive index of $Al_x Ga_{1-x}As$ with increasing x. As expected, the highest SH generation efficiency is obtained using the GaAs/AlAs heterostructure, since this combination has the largest modulation of $\chi^{(2)}$. This calculation predicts that for this material combination, QPM enhances the SH response by 280 times relative to GaAs. On the other hand, the SH efficiency drops dramatically in the $GaAs/Ga_{0.4}Al_{0.6}As$ structure because of the smaller modulation in $\chi^{(2)}$, and also because the optical absorption of the SH light becomes significant for Al concentrations less than x=0.60. An alternative method for improving the SH efficiency of the QPM heterostructure is to increase the number of layers. When the total thickness of the heterostructure is much smaller than the attenuation length (due to absorption and reflections) of the SH and fundamental light in the structure, the SH power generated should scale quadratically with the number of layers. The absorption depth of $\lambda=0.532$ μm light in GaAs is approximately 200 nm. Structures employing pure GaAs layers therefore do not increase in efficiency beyond a thickness of 0.5 μm. However, by increasing the Al content of the low Al layer, thicker structures can yield improved SH conversion efficiencies. The variation of the SH response with layer thickness for three structures consisting of alternating $Ga_{0.4}Al_{0.6}As$ and $Ga_{0.2}Al_{0.8}As$ layers is shown in FIG. 4. When the layer number is increased from 7 layers to 13 layers, the SH intensity increases by a factor of three. Upon doubling the number of layers once again, the SH intensity increases by only a factor of two. These results indicate that reflections and absorption in the structure rapidly limit further enhancements of the SH efficiency with layer number. An increase in the number of layers also results in a narrowing of the QPM resonance, and hence more stringent requirements on growth accuracy for such a structure. If the difference in the refractive indices of the layers was made even smaller, the attenuation due to multiple reflections would decrease. However, such a material combination would also have a reduced modulation depth of $\chi^{(2)}(z)/n_{2\omega}(z)$. Experimental measurements of the SH enhancement of a QPM heterostructure have been reported by the applicants in an article entitled "Quasi-phase matched second-harmonic generation in reflection" published in Optics Lett., vol. 18, pp. 589–591, 1993. The heterostructure described consisted of 13 layers of alternating GaAs and. $Al_{0.78}Ga_{0.22}As$. The thickness of the layers was 32.8±0.1 nm and 35.7±0.1 nm, respectively, as determined by x-ray diffraction. The overall periodicity of the structure was slightly off resonance but still sufficient to yield a measured intensity of up to 70 times that from a homogeneous GaAs slab. The SH intensity variation with incident angle is shown in FIG. 5 for an s-polarized fundamental beam and a p-polarized SH beam. Also shown is the SH intensity calculated using the full multilayer model described above. The agreement between theory and experiment is reasonable although the theoretical results are too large compared with experiment. The reason for this discrepancy is not clear. However, the layer periodicity of the sample was at the edge of the QPM resonance peak, as can be seen by inspection of the $GaAs/Al_{0.8}Ga_{0.2}As$ curve in FIG. 3. Therefore large changes of the SH efficiency could result from small variations in layer thickness and optical constants across the wafer. On the other hand, the SH efficiency calculated neglecting multilayer reflections yielded a result that was a factor of two smaller than the experimental data of FIG. 5. Comparison of the results with and without multilayer reflections illustrates the importance of multiple reflections in this QPM structure.

FABRY-PEROT CAVITY

The results presented in FIG. 3 show that the SH response can be enhanced by up to 280 times that of GaAs using 0.5 μm thick QPM heterostructure with no attempt to amplify the fundamental field. Thus, these QPM heterostructures can be thought of as highly nonlinear thin films. However, as suggested in previous work, Optics Lett., vol. 18, pp. 589–591, 1993, the SH efficiency of such QPM structures can be improved by several orders of magnitude by integrating them into a Fabry-Perot cavity resonant at the fundamental wavelength. Such cavities are analogous to semiconductor cavity structures now commonly used in the fabrication of VCSEL's. The effect of the cavity is to amplify the fundamental field intensity by up to two orders of magnitude, thereby increasing the SH generation efficiency of the QPM Fabry-Perot core by up to four orders of magnitude. The selection of the optimal QPM design in such vertical cavity devices is complicated by the fact that in a high finesse Fabry-Perot cavity, the fundamental field $E_\omega(z)$ consists of two counter propagating components of approximately equal magnitude. Suppressing variation of the fields parallel to the surface as before, the field in the core can be expressed as $$E_w(z) = E_\omega^+ \exp\left[i\int_z^{z_o} w_1(z')dz'\right] + E_\omega^- \exp\left[-i\int_z^{z_o} w_1(z')dz'\right], \quad (10)$$

where $z=z_o$ is the upper boundary of the core layer(s). In the initial discussion, the possibility of reflections from QPM structures within in the core are again neglected for clarity. Using the fundamental field from Eq. 10 and Eq. 2, the SH field radiated from the core will have the form (cf. Eq.4)

$$E_{SH} \approx \int_{z_2}^{z_1} \frac{1}{\omega_2(z)} \chi^2(z) : \begin{bmatrix} E_\omega^+ E_\omega^+ \exp\left\{-i\int_z^{z_0} |w_2(z')| - 2|w_1(z')| dz'\right\} + \\ E_\omega^- E_\omega^- \exp\left\{-i\int_z^{z_0} |w_2(z')| + 2|w_1(z')| dz'\right\} + \\ 2E_\omega^+ E_\omega^- \exp\left\{-i\int_z^{z_0} |w_2(z')| dz'\right\} \end{bmatrix} dz \quad (11)$$

Figure 6:
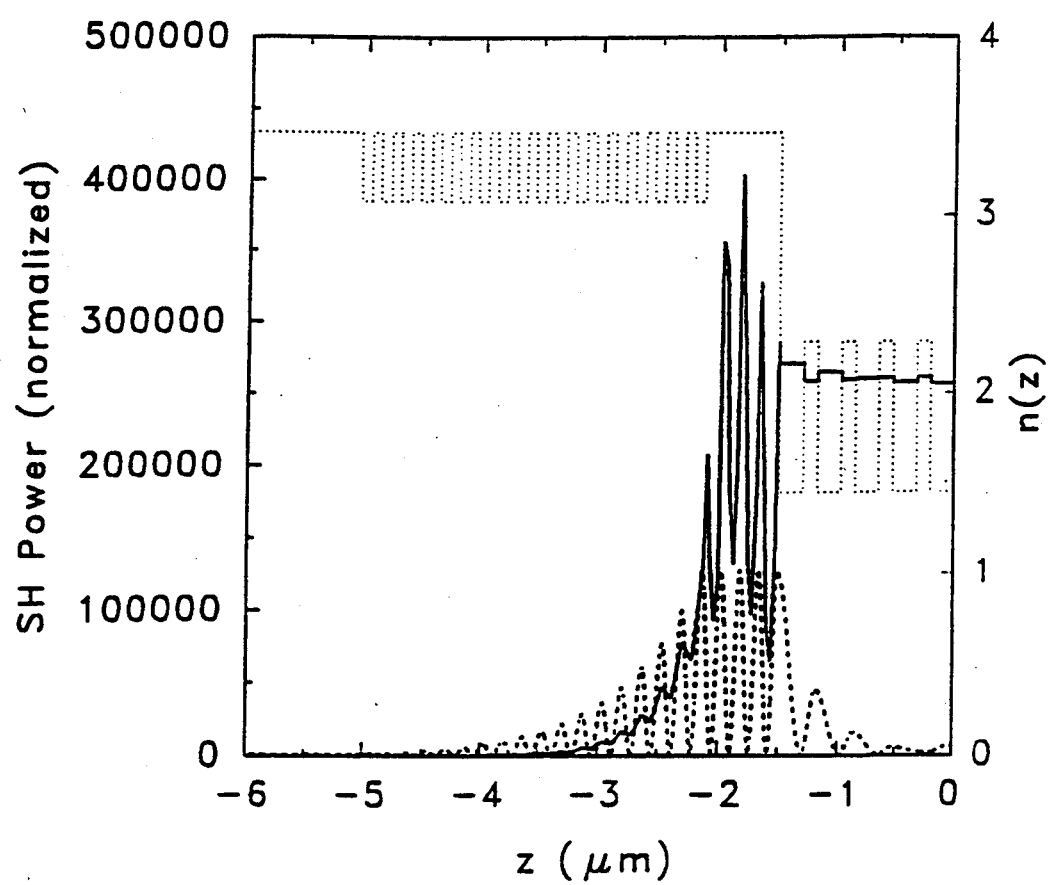
FIG. 6 is a graph of the refractive index profile n(z) shown by a dotted curve, fundamental cavity mode intensity profile shown by a dashed curve, and the upward propagating second-harmonic intensity shown by a solid curve, for a vertical cavity QPM structure in accordance with the invention.
Figure 7:
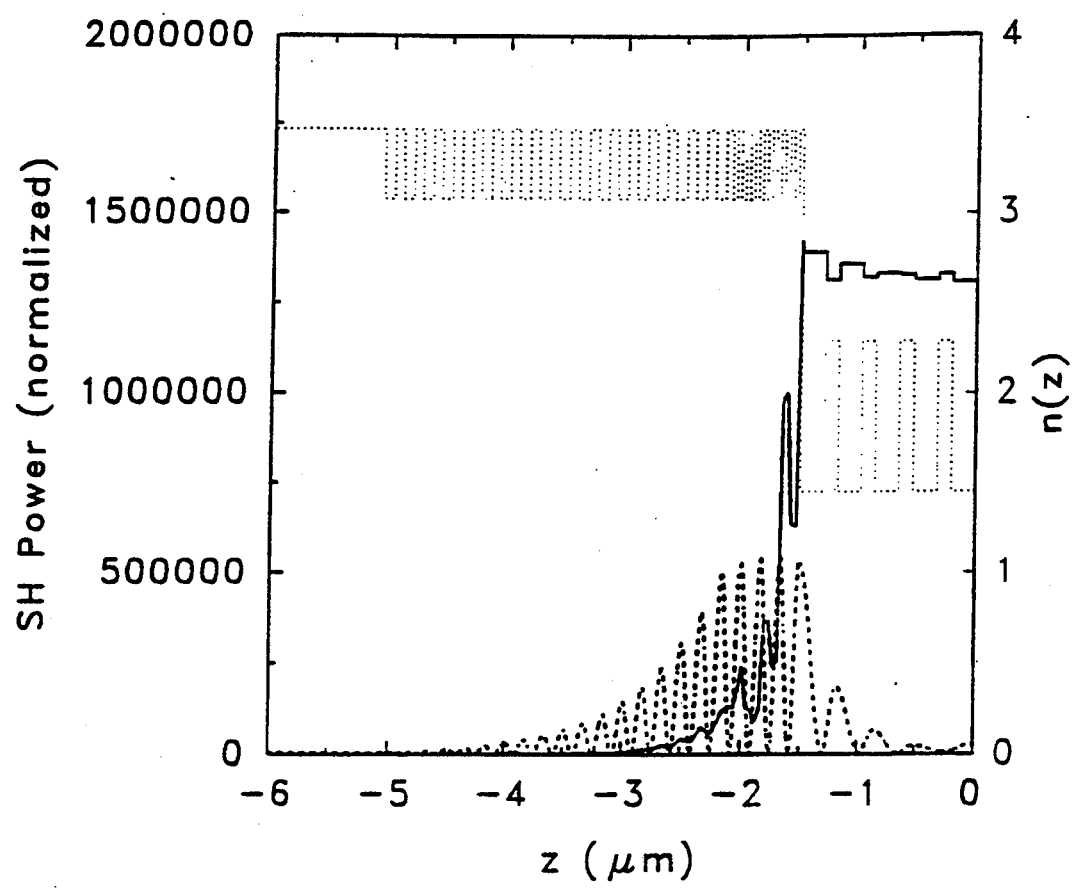
FIG. 7 is a graph of the refractive index profile n(z) shown by a dotted curve, fundamental cavity mode intensity profile shown by a dashed curve, and the upward propagating second-harmonic intensity shown by a solid curve, for a vertical cavity QPM structure with a QPM coupled to the downward propagating fundamental field.
Figure 8:
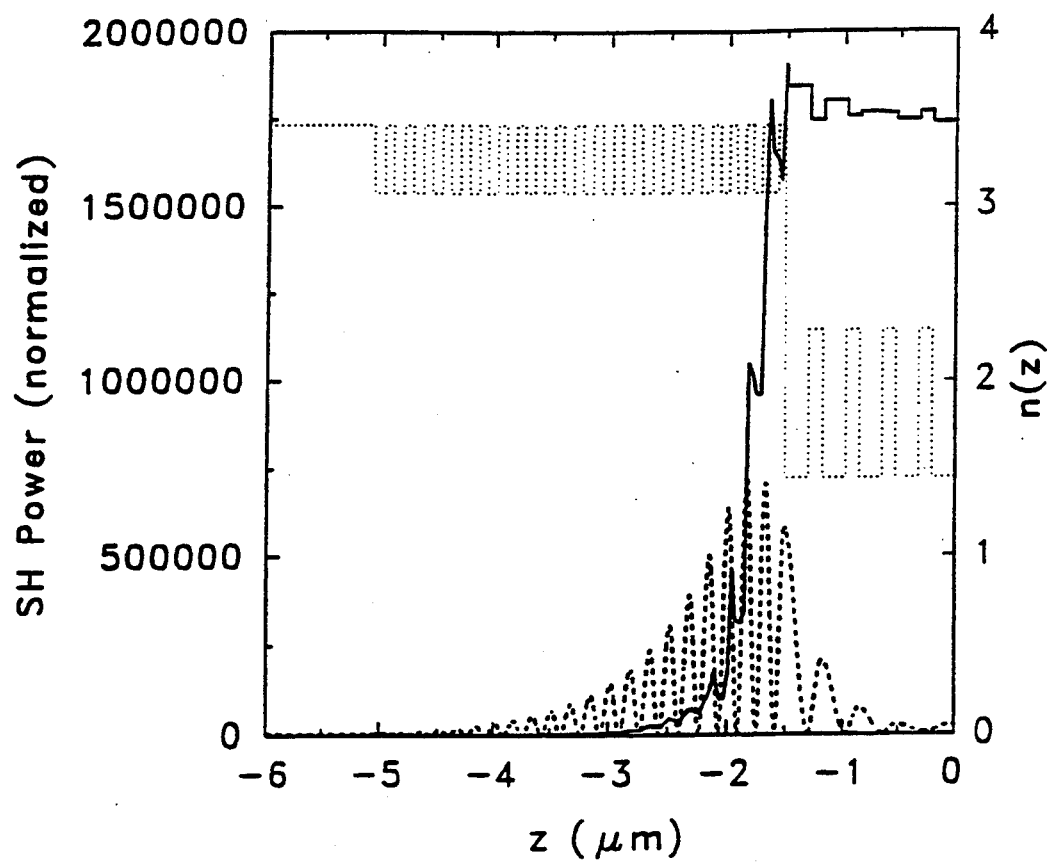
FIG. 8 is a graph of the refractive index profile n(z) shown by a dotted curve, fundamental cavity mode intensity profile shown by a dashed curve, and the upward propagating second-harmonic intensity shown by a solid curve, for a vertical cavity QPM structure with a QPM core coupled to the cross term between counter propagating fundamental fields.
Figure 9:
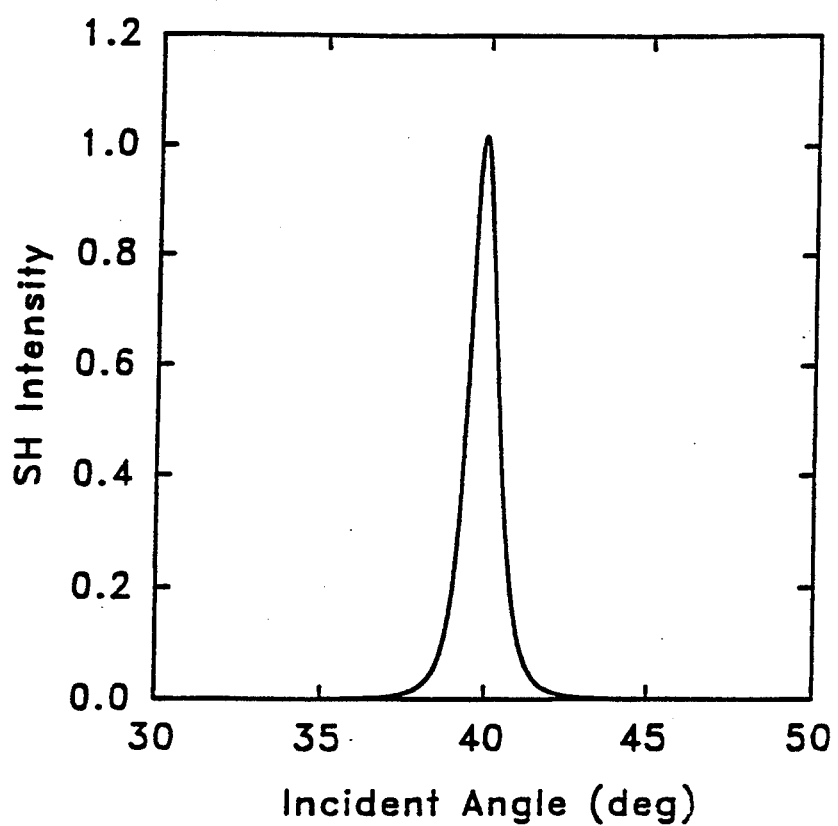
FIG. 9 is a graph of the second-harmonic intensity variation with incident angle for the vertical cavity structure of FIG. 8.

There are three spatially oscillating terms in the integrand and hence three possible QPM structures. If the optical parameters are modulated with a modulation wavevector $W = <|w(z)|-2|w_2(z)|>$, then QPM occurs by coupling to the first term in Eq. 11. This corresponds to conventional forward QPM of the SH field with the upward propagating fundamental field. However, since the core will probably be much smaller than the coherence length in GaAs (~2 μm), this implies that the core will be homogeneous. If the QPM condition of Eq. 6 is used, as in the reflection QPM geometry described heretofore, then the second term in Eq. 11 describing QPM coupling to the downward propagating fundamental fields will be enhanced. Finally, if $W = <|w_2(z)|>$ (i.e. the modulation period is the same as the average SH wavelength), then QPM occurs by coupling to the cross term between the upward and downward fundamental fields. This last case is identical to the QPM condition employed in the surface emitting SH waveguides that have been the subject of other patent applications and publications by the applicants. In this last form, QPM is symmetric, since the SH conversion efficiency is enhanced for both upward and downward radiation. The situation is further complicated because the reflector section of the vertical cavity has a modulation period of one half the fundamental wavelength. Since this will necessarily be close to the SH wavelength in the $Al_xGa_{1-x}As$ system, the latter form of QPM will occur, resulting in additional SH generation in the mirror sections. To explore the relative effectiveness of the different forms of QPM in a Fabry-Perot cavity, vertical cavities with refractive index profiles shown in FIGS. 6, 7 and 8 were modeled. The bottom reflector consisted of 17 repetitions of a GaAs and $Al_{0.8}Ga_{0.2}As$ layer pair. The top reflector consisted of a dielectric stack consisting of 9 alternating layers of $SiO_2$ and $Nb_2O_5$. Such dielectric top reflectors have been used in VCSELs to avoid high electrical resistances found in semiconductor reflector layers. In the present application, the advantage of a dielectric stack is the absence of absorption at $\lambda=0.532$ μm; therefore, essentially all the SH light radiated from the upper surface of the core reaches the surface. The core structure chosen for all three types of QPM was approximately 0.5 μm thick. The combined thickness of the core and bottom reflector was approximately 3.4 μm, which is easily achieved using current MBE growth technology. The entire structure was tuned to be in resonance for a fundamental wavelength of $\lambda=1.06$ μm at an incident (in vacuum) angle of $\theta=40°$. FIG. 6 shows the SH power propagating towards the surface in a vertical cavity with a uniform GaAs core. As indicated previously, because of the near QPM resonance in the $Al_xGa_{1-x}As$ reflector, the SH power begins to build up in the reflector stack. Within the core region the SH power undergoes large oscillations as it propagates to the surface but does not grow significantly beyond that generated in the underlying reflector stack. The oscillations are a result of the interference between the three terms in the integrand of Eq. 11. The resulting SH power emitted from the structure is approximately $3\times10^5$ more than that radiated from a homogeneous GaAs surface under identical excitation conditions. This enhancement is largely due to the amplification of the fundamental field in the Fabry-Perot cavity, and the inadvertent QPM occurring in the bottom reflector layers. In FIG. 7, the SH power propagating through a vertical cavity consisting of a QPM structure is identical to that described heretofore. This case corresponds to QPM coupling involving the second term in Eq. 11. As before, the QPM structure consists of alternating $Al_{0.8}Ga_{0.2}As$ and GaAs layers, with a thickness of 37.7 nm each. Although the SH power still undergoes large oscillations in the core region, there is an overall growth of the SH power as it propagates through the core. As a result, the inclusion of the QPM structure increases the SH efficiency by a factor of five relative to the uniform core of FIG. 6. Finally, in FIG. 8, the SH power propagating through a cavity with a modulation period equal to the average SH wavelength in the core is shown. Again, the QPM structure consists of alternating 76.6 nm thick $Al_{0.8}Ga_{0.2}As$ and 64.2 nm thick GaAs layers. This structure achieves QPM coupling with the third term in Eq. 11, and hence, results from the mixing of the counter-propagating fundamental beams within the cavity. In this case, the SH power increases almost monotonically as it propagates through the core region, indicating that this is the most efficient form of QPM for a vertical cavity frequency doubler. The overall efficiency of this structure is an order of magnitude better than a cavity with a uniform core, yielding an overall efficiency of $1.75\times10^6$ that of a homogeneous GaAs surface. Note that in all three cases, the fundamental field intensities within the cavity are almost identical. The intensity profile in the cavity in FIG. 8 appears slightly more rounded, compared with the intensity profiles in FIGS. 6 and 7. The periodicity of the QPM core structure is close to $\lambda/2$, and hence the fundamental fields are more strongly coupled to this QPM structure. The Fabry-Perot devices described here are finely tuned resonant devices. As a result the SH efficiency of these structures is a sensitive function of incident angle as well as the fundamental wavelength. The variation of the SH response with incident angle for the vertical cavity QPM device of FIG. 8, is shown in FIG. 9. Unlike the slow variation of the SH enhancement for a simple QPM structure, the vertical cavity device is sharply peaked about the resonant angle of $\theta = 40°$. Thus, in applications where a high finesse vertical cavity device is pumped by a external source, the relative orientation of the source and frequency doubler would have to be accurately adjusted and rigidly maintained.

Figure 11:
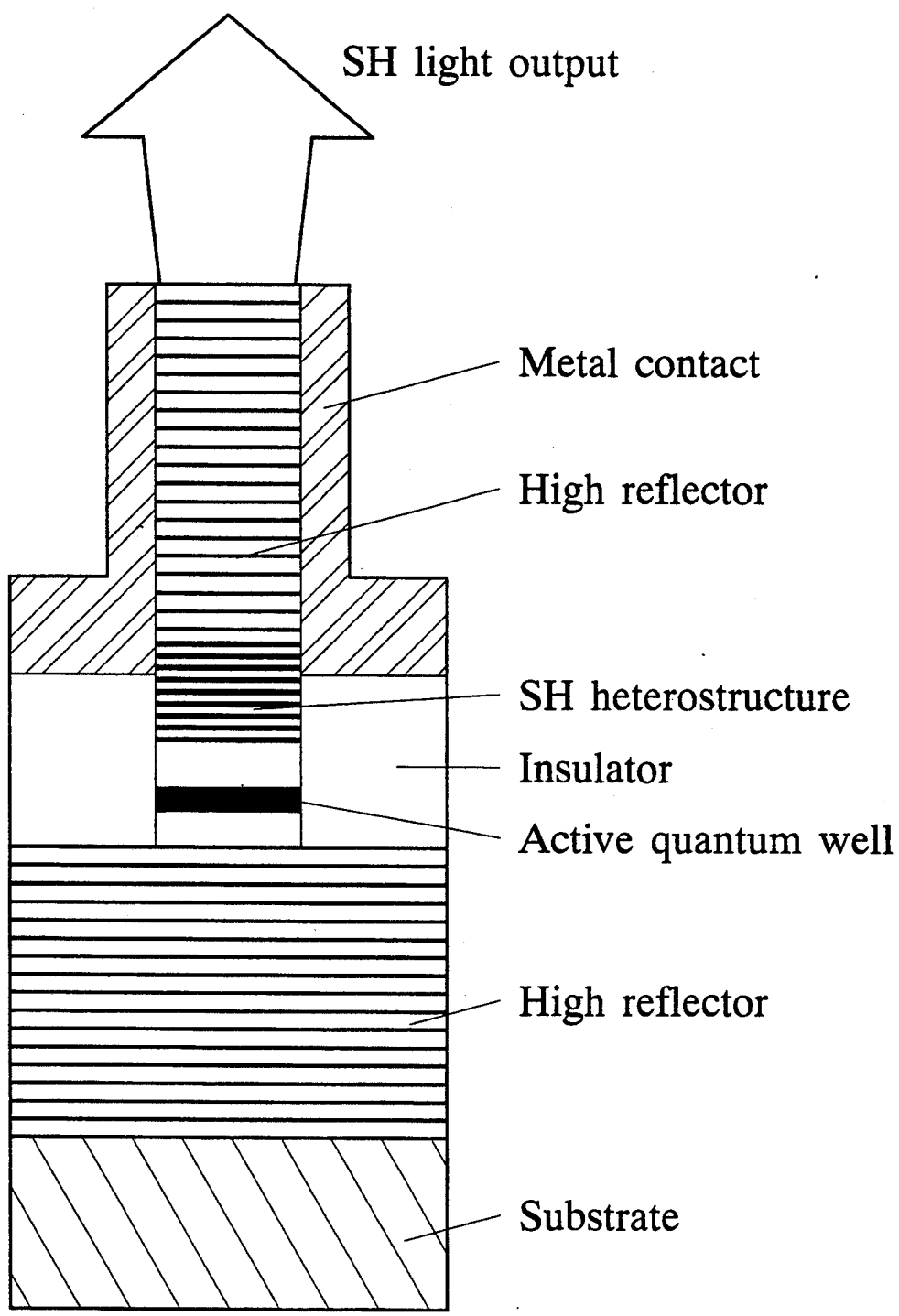

Through the use of QPM in the $Al_xGa_{1-x}As$ system extremely high SH conversion efficiencies can be achieved, considering the small interaction lengths involved. For example, for the same excitation power, the GaAs/AlAs QPM structure of FIG. 3 will generate approximately an order of magnitude more SH power than nonlinear crystals such as $LiIO_3$ and $LiNbO_3$ of equivalent thickness. Thus the simple QPM structure as described may prove a useful substitute for nonlinear dielectric crystals in applications where very short interaction lengths are critical. The measurement of femtosecond optical pulse duration using SH autocorrelation is one case where a short interaction length is desirable to reduce the broadening by group velocity dispersion. As indicated by the results of FIG. 4, absorption and reflection losses limit the total active thickness of these QPM structures to a few microns. This constraint ultimately limits the efficiency of QPM attainable in $Al_xGa_{1-x}As$ based devices. However, the general principles outlined here may be applied to other nonlinear semiconductors, such as GaP, which have a larger band gap and hence reduced absorption. The combination of QPM in a vertical cavity Fabry-Perot heterostructure can achieve SH conversion efficiencies four orders of magnitude larger than the simple QPM structure. Since the core can be less than 1 $\mu$m thick and the top reflector can be deposited using a non-absorbing dielectric material, virtually all the SH light in the core is radiated from the surface. Thus the ultimate SH conversion efficiency of these devices depends on the finesse of the cavity and the damage threshold of the $Al_xGa_{1-x}As$ multilayer. The SH power generated by the vertical cavity QPM structure of FIG. 8, using a CW 10 mW beam focused on a 10 $\mu$m spot, is approximately 1 nW. This power level is clearly visible to the eye, and hence is suitable for display applications as well as signal processing in the MHz frequency range. The conversion efficiency will, of course, scale as the square of the average incident power, and inversely with duty cycle for pulsed laser sources. The fabrication of such high finesse cavities requires the same accurate control of layer growth as for VCSEL lasers. Extremely small device size is possible when frequency doubling using vertical cavity QPM. The total thickness of the structures in FIG. 6 through 8 is less than 6 $\mu$m. The lateral dimensions of the device are determined by the fundamental beam profile, which can be less than 10 $\mu$m. Also, the vertical cavity QPM structures can be excited by transmission as well as reflection, since for a reasonably high finesse, the counter propagating fundamental beams within the cavity have the same amplitude. Thus, for example, a vertical cavity QPM structure supported by a thinned GaAs substrate, fastened to the cleaved end of an optical fiber, could be used to frequency double the fiber output. Finally, the most intriguing possibility is the integration of a vertical cavity laser with a QPM structure. The vertical cavity structures discussed are very similar in design with known VCSEL cavities employing dielectric top mirrors. By incorporating gain regions into the QPM core, it should be possible to fabricate surface emitting lasers which radiate coherent visible light. An example of a VCSEL having a QPM core is shown in FIG. 11. Unfortunately, as noted, since the mode of a vertical cavity laser propagates perpendicular to the surface normal, a conventional (100) oriented VCSEL will not radiate at the SH wavelength. This problem can be circumvented by growing VCSEL cavities on (111) substrates. Although growth on (111) substrates is a relatively new technology, low threshold (111) grown edge emitting lasers have been demonstrated by I. W. Tao and W. I. Wang, in a publication entitled "Strained InGaAs quantum well lasers grown in (111)BGaAs," Electron. Lett., vol. 22, pp.705–706, 1992. Thus a (111) VCSEL may be a viable extension of conventional (100) grown VCSEL technology. Since VCSEL lasers are capable of radiating CW light in the 10 mW range, it is believed that active QPM VCSEL's should be able to generate visible coherent beams at nW power levels.

In conclusion, the applicants have carried out an investigation of SH generation in $Al_xGa_{1-x}As$ heterostructures using a model which includes the measured variation of the SH susceptibilities with x and the effect of multilayer reflections. The effect of QPM and enhancement of the fundamental field in a resonant Fabry-Perot cavity was studied. An $Al_xGa_{1-x}As$ QPM heterostructure is found to be capable of enhancing the SH generation efficiency of the heterostructure by 280 times relative to a homogeneous GaAs surface. Theoretical results for a simple QPM structure were in good agreement with experimental results. The model was also used to evaluate the relative efficiencies of three QPM core structures in a Fabry-Perot cavity. The SH conversion efficiency of the optimal vertical cavity QPM structure is $1.75 \times 10^6$ that of a homogeneous GaAs surface, and an order of magnitude larger than for a similar cavity that did not employ QPM.

We claim:

1. A reflection geometry semiconductor heterostructure for generating second-harmonic light from a single fundamental beam directed toward a surface of the heterostructure, comprising a material being at least semi-transparent having nonlinear properties and a region wherein the optical properties are varied periodically such that the wave vector of the variation in the material is approximately equal to the difference between two times the wave vector of the single fundamental beam and a second-harmonic beam generated in the material and propagating from the same surface of the heterostructure.

2. A semiconductor heterostructure for generating second-harmonic light as defined in claim 1, where in the optical properties comprise at least one of the index of refraction and second order harmonic susceptibility.

3. A semiconductor heterostructure for generating second-harmonic light as defined in claim 2 wherein the region includes alternating layers of a first material and a second material and wherein at least one of the first and second material has a second order susceptibility such that it is capable of generating second harmonic light when illuminated, the first and second materials being at least semi-transparent to the fundamental beam and to generated second harmonic light.

4. A semiconductor heterostructure for generating second-harmonic light as defined in claim 2 further including reflecting means forming a Fabry-Perot cavity at the fundamental wavelength containing the region.

5. A semiconductor heterostructure for generating second-harmonic light as defined in claim 2 wherein the reflecting means are formed about the heterostructure by the process of thin film deposition or by growing the said means on the heterostructure.

6. A semiconductor heterostructure for generating second-harmonic light as defined in claim 4 further comprising means of providing gain within the Fabry Perot cavity for generating laser oscillation at a fundamental wavelength.

7. A semiconductor heterostructure for generating second-harmonic light comprising:

a plurality of alternating layers of a first material and a second material, one of the first and second materials having a second order susceptibility such that it is capable of generating second harmonic light when illuminated, the first and second materials being at least semi-transparent to a fundamental beam and to the second harmonic light generated, any two adjacent layers of the alternating layers being arranged in a periodic fashion, such that a layer of width $l_1$ of the first material is adjacent a layer of width $l_2$ of the second material, $l_1 + l_2$ defining the length of one period, the periodicity of the layers being such that $$l_1 + l_2 \approx (<1/\lambda_{SH} + 2/\lambda_o>)^{-1}$$

wherein the $<>$ denotes an average value throughout the entire region and wherein $\lambda_{SH}$ is a wavelength of a second-harmonic beam generated by the fundamental beam and $\lambda_o$ is the wavelength of the fundamental beam.

8. A semiconductor heterostructure for generating second-harmonic light comprising:

a plurality of alternating layers of a first material and a second material, one of the first and second materials having a second order susceptibility such that it is capable of generating sum-frequency light when illuminated, the first and second materials being at least semi-transparent to a fundamental beam and to sum-frequency light generated, any two adjacent layers of the alternating layers being arranged in a periodic fashion, such that a layer of width $l_1$ of the first material is adjacent a layer of width $l_2$ of the second material, $l_1 + l_2$ defining the length of one period, the periodicity of the layers being such that $$l_1 + l_2 \approx <\frac{\lambda_{sh}}{2}>$$

wherein the $<>$ denotes an average value throughout the entire region and wherein $\lambda_{SH}$ is a wavelength of a second-harmonic beam generated by the fundamental beam; and, including reflecting means bounding outer most layers forming a Fabry Pérot cavity at the fundamental wavelength.

9. A semiconductor heterostructure for generating second-harmonic light comprising:

a laser cavity including a means for providing optical gain and, a plurality of alternating layers of a first material and a second material, one of the first and second materials having a second order susceptibility such that it is capable of generating sum-frequency light when illuminated, the first and second materials being at least semi-transparent to a fundamental beam and to sum-frequency light generated, any two adjacent layers of the alternating layers being arranged in a periodic fashion, such that a layer of width $l_1$ of the first material is adjacent a layer of width $l_2$ of the second material, $l_1 + l_2$ defining the length of one period, the periodicity of the layers being such that $$l_1 + l_2 \approx (<1/\lambda_{SH} + 2/\lambda_o>)^{-1}$$

wherein the $<>$ denotes an average value throughout the entire region and wherein $\lambda_{SH}$ is a wavelength of a second-harmonic beam generated by the fundamental beam and $\lambda_o$ is the wavelength of the fundamental beam, within the laser cavity forming a vertical-cavity surface-emitting lasers having a quasi-phase matched region.

* * * * *